(12) United States Patent
Xu et al.

(10) Patent No.: US 10,373,951 B1
(45) Date of Patent: Aug. 6, 2019

(54) PACKAGE-EMBEDDED THIN-FILM CAPACITORS, PACKAGE-INTEGRAL MAGNETIC INDUCTORS, AND METHODS OF ASSEMBLING SAME

(71) Applicant: Intel Corporation, Santa Clara, CA (US)

(72) Inventors: Cheng Xu, Chandler, AZ (US); Rahul Jain, Gilbert, AZ (US); Seo Young Kim, Chandler, AZ (US); Kyu Oh Lee, Chandler, AZ (US); Ji Yong Park, Chandler, AZ (US); Sai Vadlamani, Chandler, AZ (US); Junnan Zhao, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/017,247

(22) Filed: Jun. 25, 2018

(51) Int. Cl.
| | |
|---|---|
| *H01L 27/07* | (2006.01) |
| *H01L 23/64* | (2006.01) |
| *H01L 23/522* | (2006.01) |
| *H01L 23/00* | (2006.01) |
| *H01L 49/02* | (2006.01) |

(52) U.S. Cl.
CPC ...... *H01L 27/0788* (2013.01); *H01L 23/5223* (2013.01); *H01L 23/5227* (2013.01); *H01L 23/642* (2013.01); *H01L 23/645* (2013.01); *H01L 24/09* (2013.01); *H01L 28/10* (2013.01); *H01L 28/40* (2013.01)

(58) Field of Classification Search
CPC . H01L 27/0788; H01L 28/10; H01L 23/5227; H01L 23/642; H01L 23/645; H01L 24/09; H01L 23/5223; H01L 28/40
See application file for complete search history.

(56) References Cited

U.S. PATENT DOCUMENTS

| | | | | |
|---|---|---|---|---|
| 6,806,569 | B2* | 10/2004 | Breisch | H01L 23/48 257/691 |
| 6,958,095 | B2* | 10/2005 | Kakimoto | H01L 21/67092 118/314 |
| 7,821,371 | B2* | 10/2010 | Inoue | H01F 1/15366 148/304 |
| 9,831,159 | B2* | 11/2017 | Cho | H01L 21/4853 |
| 2017/0042044 | A1* | 2/2017 | Miyamoto | H05K 3/108 |
| 2017/0287853 | A1* | 10/2017 | Kim | H01L 23/3114 |
| 2019/0006252 | A1* | 1/2019 | Akkinepally | H01L 23/13 |

OTHER PUBLICATIONS

Norberg, Gunnar, "Elastomer Chip Sockets for Reduced Thermal Mismatch Problems and Effortless Chip Replacement, Preliminary Investigations", IEEE Transactions on Advanced Packaging, vol. 26, No. 1, (Feb. 2003), 33-40.

* cited by examiner

*Primary Examiner* — William Coleman
(74) *Attorney, Agent, or Firm* — Schwegman Lundberg & Woessner, P.A.

(57) ABSTRACT

Disclosed embodiments include an embedded thin-film capacitor and a magnetic inductor that are assembled in two adjacent build-up layers of a semiconductor package substrate. The thin-film capacitor is seated on a surface of a first of the build-up layers and the magnetic inductor is partially disposed in a recess in the adjacent build up layer. The embedded thin-film capacitor and the integral magnetic inductor are configured within a die shadow that is on a die side of the semiconductor package substrate.

23 Claims, 7 Drawing Sheets

PACKAGE-EMBEDDED THIN-FILM CAPACITORS, PACKAGE-INTEGRAL MAGNETIC INDUCTORS, AND METHODS OF ASSEMBLING SAME

FIELD

This disclosure relates to power delivery for semiconductor device packages.

BACKGROUND

Semiconductive device miniaturization connected to device packaging, includes challenges to fit sufficient passives near semiconductive devices, while competing for space on semiconductor package substrates.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Package-embedded thin-film capacitors (eTFCs) are assembled with package-integral magnetic inductors (iMLs) within a semiconductor package substrate portion. The package-embedded TFCs are placed upon a lithography ("litho") surface of a build-up film such as an Anjomoto build-up film (ABF) type. Simultaneously, an integral magnetic inductor is assembled, beginning on the litho surface, where an inductor-core trace is partially covered with a first magnetic particle paste. The build-up film is opened to expose more of the inductor-core trace, and a complementary magnetic particle paste contacts both the inductor-core trace and the first magnetic particle paste. Another build-up film is formed over the eTFC and the iML. Assembly and fabrication of the respective eTFC and iML are accomplished within a die shadow that is configured to receive a semiconductive device, where the die shadow overlaps the eTFC and the iML. Z-height issues for capacitors are subsumed within the semiconductor package substrate and within the die shadow. Long-inductive-path issues for inductors are subsumed within the semiconductor package substrate and within the die shadow.

Figure 1A:
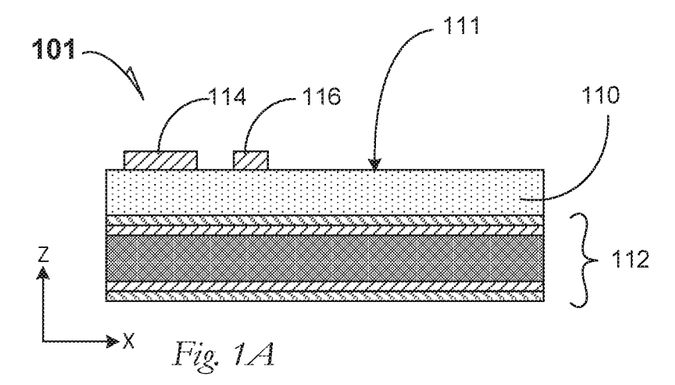
FIG. 1A is a cross-section elevation of a semiconductor package substrate during fabrication of a package-embedded thin-film capacitor and a package-integral magnetic inductor according to an embodiment.

FIG. 1A is a cross-section elevation of a semiconductor package substrate 101 during fabrication of a package-embedded thin-film capacitor and a package-integral magnetic inductor according to an embodiment. A package-embedded TFC embodiment may be referred to as an eTFC, which is also an embedded parallel-plate capacitor. A package-integral magnetic inductor may be referred to as an iML.

A lamination film 110 is affixed to a carrier core 112 in preparation for forming contacts on a lithography ("litho") surface 111 of the lamination film 110. In an embodiment, processing includes a desmear technique, followed by electroless plating onto the litho surface 111. Patterning a dry-film resist (DFR, not pictured), electrolytic plating, stripping the DFR, and flash etching result in a plurality of conductive structures such as a bond pad 114 and an inductor-core trace 116 in an embodiment.

Figure 1B:
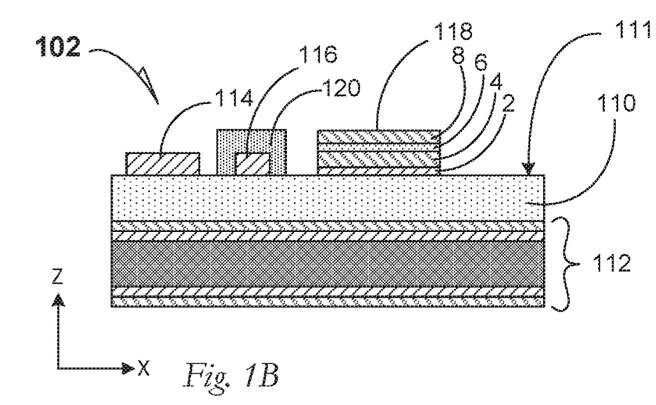
FIG. 1B is a cross-section elevation of the semiconductor package substrate depicted in FIG. 1A after further processing according to an embodiment.

FIG. 1B is a cross-section elevation of the semiconductor package substrate 101 depicted in FIG. 1A after further processing according to an embodiment. The semiconductor package substrate 102 has been processed by seating a thin-film capacitor (TFC) 118 on the litho surface 111. In an embodiment, the TFC 118 is a ceramic TFC 118 with a structure, beginning at the litho surface 111, with a copper-containing layer 2, a nickel-containing layer 4, a barium titanate (BTO) containing layer 6, and a copper-containing layer 8. Other suitable TFC structures may be used depending upon a given application. For example, wherein the thin-film capacitor 118 is made from different useful materials, the thin-film capacitor 118 includes, beginning at first lithographic surface 111, a first metal-containing layer 2, a subsequent metal-containing layer 4 different from the first metal-containing layer, a dielectric layer 6 and a third metal-containing layer 8. For example, the first metal-containing layer 2 is a copper-rich alloyed with silver, the subsequent metal-containing layer 4 is a nickel-containing layer, the dielectric layer 6 is a barium-titanium oxide layer, and the third metal-containing layer 8 is a repeat of the copper-rich layer alloyed with silver.

In an embodiment, an inductor-core trace 116 has been processed by covering it with a first magnetic-particle paste 120. In an embodiment, the magnetic-particle paste 120 includes dielectric coatings that allow direct contact to the inductor core 116 without the magnetic particles shorting into the inductor-core trace 116.

In an embodiment, the inductor-core trace 116 and the magnetic-particle paste 120 have a Z-height that is less than that of the thin-film capacitor 118. In an embodiment, the inductor-core trace 116 and the magnetic-particle paste 120 have a Z-height that is about equal (within 0.1 micrometer) that of the thin-film capacitor 118. In an embodiment, the inductor-core trace 116 and the magnetic-particle paste 120 have a Z-height that is greater than that of the thin-film capacitor 118.

Figure 1C:
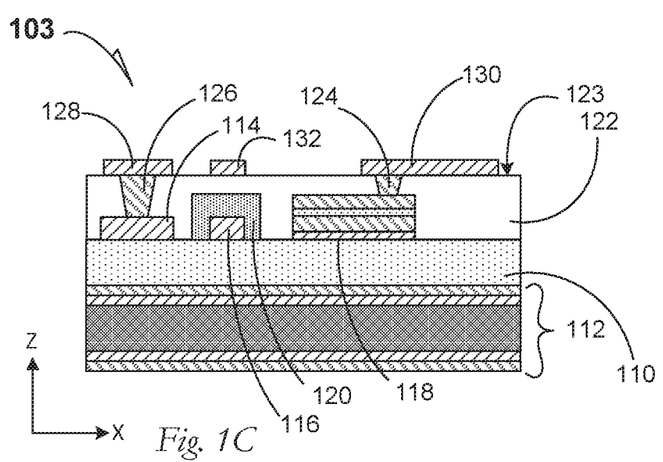
FIG. 1C is a cross-section elevation of the semiconductor package substrate depicted in FIG. 1B after further processing according to an embodiment.

FIG. 1C is a cross-section elevation of the semiconductor package substrate 102 depicted in FIG. 1B after further processing according to an embodiment. The semiconductor package substrate 103 has been processed by laminating a build-up film 122 over the TFC 118, the pad 114 and the first magnetic-particle paste 120. The build-up film 122 includes a litho surface 123. Hereinafter, the build-up film 110 may be referred to as a first build-up film 110 and the build-up film 122 may be referred to as a second and adjacent build-up film 122.

In further processing according to an embodiment, the litho surface 123 is opened, a TFC via 124 and a package via 126 are filled after laser drilling into the build-up film 122. Further processing includes semi-additive processing (SAP) at the litho surface 123 to form a package-via pad 128, a TFC-via pad 130, and top trace 132 according to an embodiment.

Figure 1D:
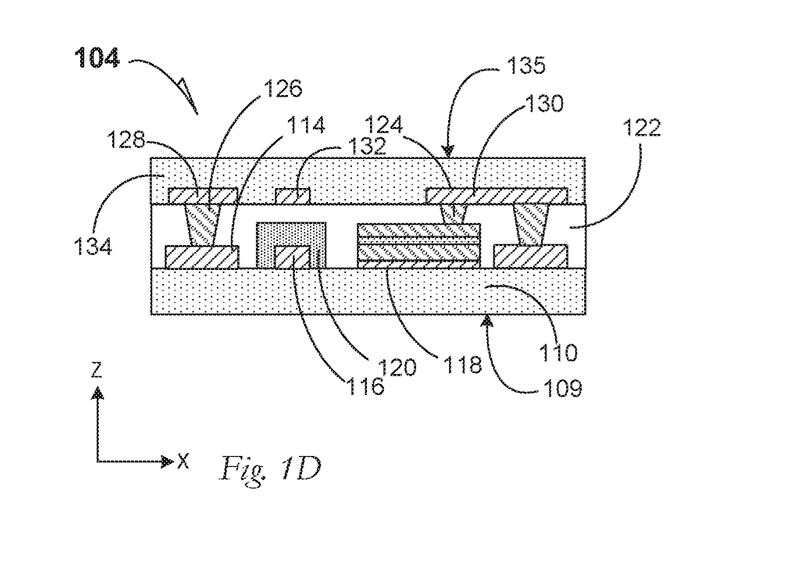
FIG. 1D is a cross-section elevation of the semiconductor package substrate depicted in FIG. 1C after further processing according to an embodiment.

FIG. 1D is a cross-section elevation of the semiconductor package substrate 103 depicted in FIG. 1C after further processing according to an embodiment. The semiconductor package substrate 104 has been processed by laminating a land-side film 134, followed by removing the carrier 112 (see FIGS. 1A, 1B and 1C). After removing the carrier 112, a die side 109 and a land side 135 of the semiconductor package substrate 103 are available for further processing.

Figure 1E:
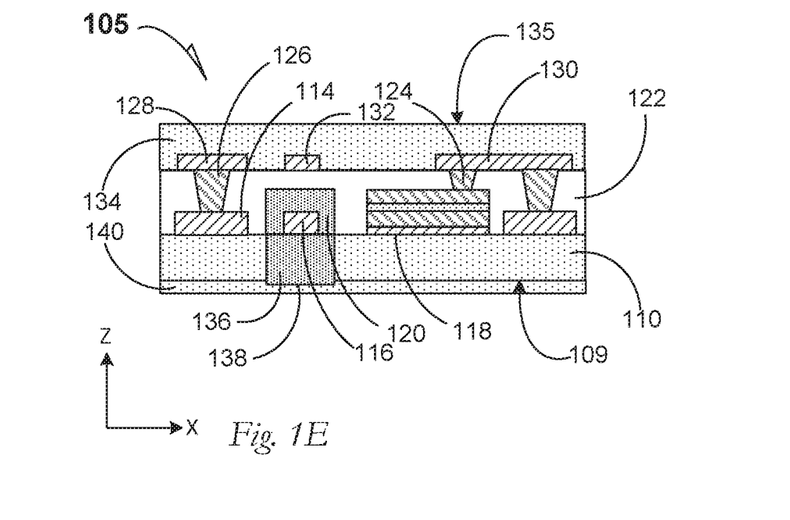
FIG. 1E is a cross-section elevation of the semiconductor package substrate depicted in FIG. 1D after further processing according to an embodiment.

FIG. 1E is a cross-section elevation of the semiconductor package substrate 104 depicted in FIG. 1D after further processing according to an embodiment. The semiconductor package substrate 105 has been processed by opening the die side 109, filling a complementary magnetic-particle paste 136 to cover the inductor-core trace 116 where the first magnetic-particle paste 120 did not, and thereby forming an integral magnetic inductor 138 that includes the inductor-core trace 116, the first magnetic-particle paste 120 and the complementary magnetic-particle paste 136.

Thereafter in an embodiment, a die-side laminate 140 is formed on the die side 109 of the lamination film 110 in preparation for further patterning and forming a die-side solder resist.

Figure 1F:
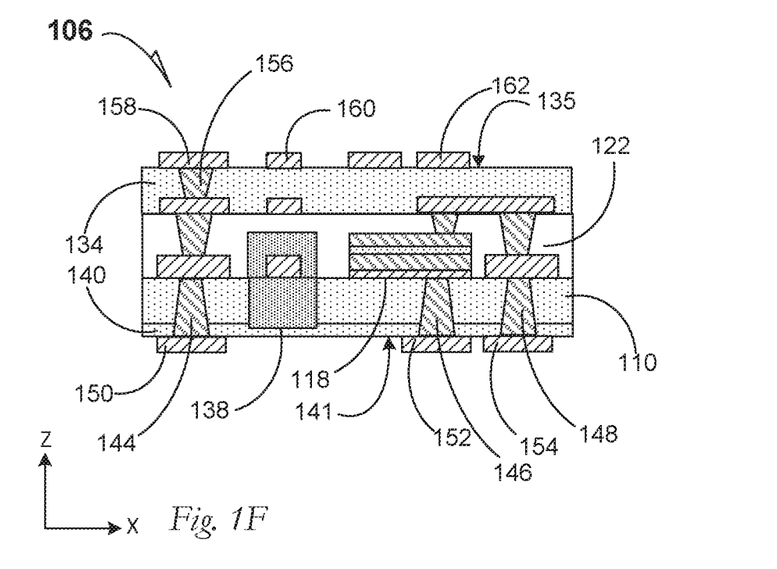
FIG. 1F is a cross-section elevation of the semiconductor package substrate depicted in FIG. 1E after further processing according to an embodiment.

FIG. 1F is a cross-section elevation of the semiconductor package substrate 105 depicted in FIG. 1E after further processing according to an embodiment. The semiconductor package substrate 106 has been processed by opening the die-side laminate 140 at a die side litho surface 141, and filling a die-side package via 144, a die-side TFC first via 146 and a die-side TFC subsequent via 148. Processing at the die side litho surface 141 includes patterning a die-side bond pad 150, a TFC first bond pad 152 and a TFC subsequent bond pad 154 according to an embodiment. It may now be observed that whereas the die-side laminate 140 is depicted thinner than the first laminate 110, the relative Z-direction thicknesses are similar in an embodiment within useful semiconductor package substrate processing techniques.

The semiconductor package substrate 106 has also been processed by opening the land-side laminate 134 at the land side litho surface 135, and by filling a land-side package via 156. Further processing included patterning a land-side package bond pad 158, a land-side trace 160, and a land-side bond pad 162. Other useful and incidental bonds pads and traces are present on the land-side surface 135 according to an embodiment.

Figure 1G:
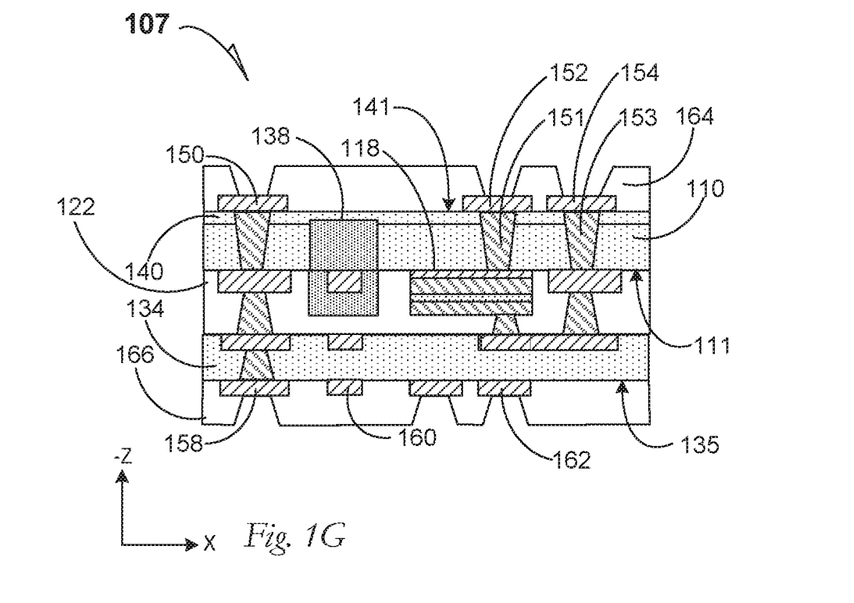
FIG. 1G is a cross-section elevation of the semiconductor package substrate depicted in FIG. 1F after further processing according to an embodiment.

FIG. 1G is a cross-section elevation of the semiconductor package substrate 106 depicted in FIG. 1F after further processing according to an embodiment. The semiconductor package substrate 107 has been vertically inverted (negative-Z direction). In an embodiment, the semiconductor package substrate 107 has been processed at the die side litho surface 141 by a die-side solder resist 164, and the package bond pad 150 and the TFC bond pads 152 and 154 have been exposed through the die-side solder resist 164.

In an embodiment, the first TFC bond pad 152 contacts a first capacitor via 151 that communicates to the die side of the semiconductor package substrate 107, and a subsequent bond pad 154 contacts a subsequent capacitor via 153 that also communicates to the die side of the semiconductor package substrate 107.

Further processing is done according to an embodiment, by forming a land-side solder resist 166 and the land side package bond pad 158 have been exposed through the land-side solder resist 164.

In an embodiment, a through-package via begins at the land-side package bond pad 158, couples to several vias and bond pads, and emerges at the die-side bond pad 150. Other package vias are illustrated including those commencing at the die-side bond pad 152, coupling the TFC 118, and terminating at the die-side TFC bond pad 154. Other package vias connect the magnetic inductor 138, but they are in a different plane from the drawing.

In an embodiment, the several magnetic-particle pastes are cured and may be referred to as magnetic-particle bodies.

Figure 2:
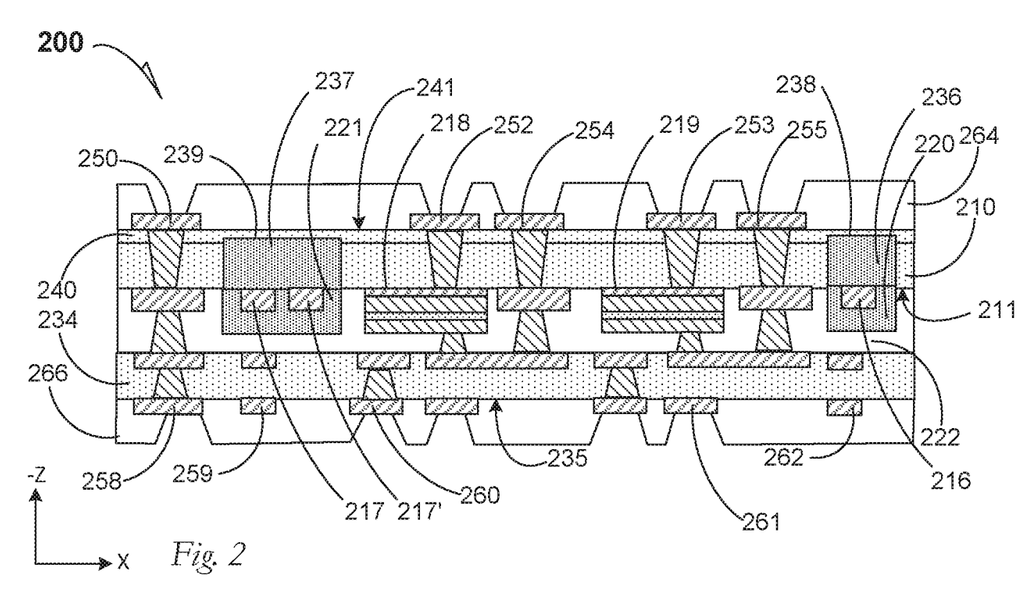
FIG. 2 is a cross-section elevation of a semiconductor package substrate according to several embodiments.

FIG. 2 is a cross-section elevation of a semiconductor package substrate 200 according to several embodiments. Structures depicted in FIGS. 1A through 1G may be analogously found within the semiconductor package substrate 200 depicted in FIG. 2.

A lamination film 210 includes a litho surface 211 onto which a first TFC 218 and a subsequent TFC 219 have been affixed. In an embodiment, a first magnetic inductor 238 includes a first inductor trace 216 that is enclosed in a first magnetic-particle paste 220 and a first complementary magnetic-particle paste 236. In an embodiment, a subsequent magnetic inductor 239 includes a plurality of subsequent inductor traces 217 and 217', and a single magnetic-particle paste body that includes a subsequent magnetic-particle paste 221 and a complementary subsequent magnetic-particle paste 237. The eTFCs 218 and 219 as well as the magnetic-particle pastes 220 and 221 have been covered by laminating with a build-up film 222. Accordingly in an embodiment, the semiconductor package substrate 200 includes two eTFCs 218 and 219, a first iML 238 with a single inductor trace 216 that is contacted by a single magnetic-particle paste body 238 and 220, and similarly, a second type of iML 239 with two inductor traces 217 and 217', both inductor traces 217 and 217' of which are contacted by a single magnetic-particle paste body 237 and 221.

In an embodiment and similar to the several process flows depicted in FIGS. 1A through 1G, a carrier is separated from the first lamination film 210, a die-side laminate 240 completes enclosure of the iMLs 238 and 239, and a die-side solder resist 264 has been formed, from which several die-side bond pads 250, 252, 253, 254 and 255 are exposed. Processing uses a die-side litho surface 241 to create solder-resist opens that expose the several die-side bond pads 250, 252, 253, 254 and 255.

A land-side film 234 with several vias is covered by a land-side solder resist 266, through which several bond pads, e.g., 258, 260 and 261 and are exposed. Processing uses a land-side litho surface 235 to create solder-resist opens that expose the several land-side bond pads 258, 260 and 261. Incidental traces 259 and 262 are also seen at the land-side litho surface 235, which are useful for connection applications.

In an embodiment, a through-package via begins at the land-side bond pad 258, couples to several vias and bond pads, and emerges at the die-side bond pad 250. Other package vias are illustrated including those commencing at die-side TFC bond pads 252 and 253, coupling the respective eTFCs 218 and 219, and terminating at respective land-side bond pads 254 and 255. Other package vias connect the several iMLs 238 and 239, but the vias are in different planes compared to the plane of the drawing in FIG. 2.

Figure 3:
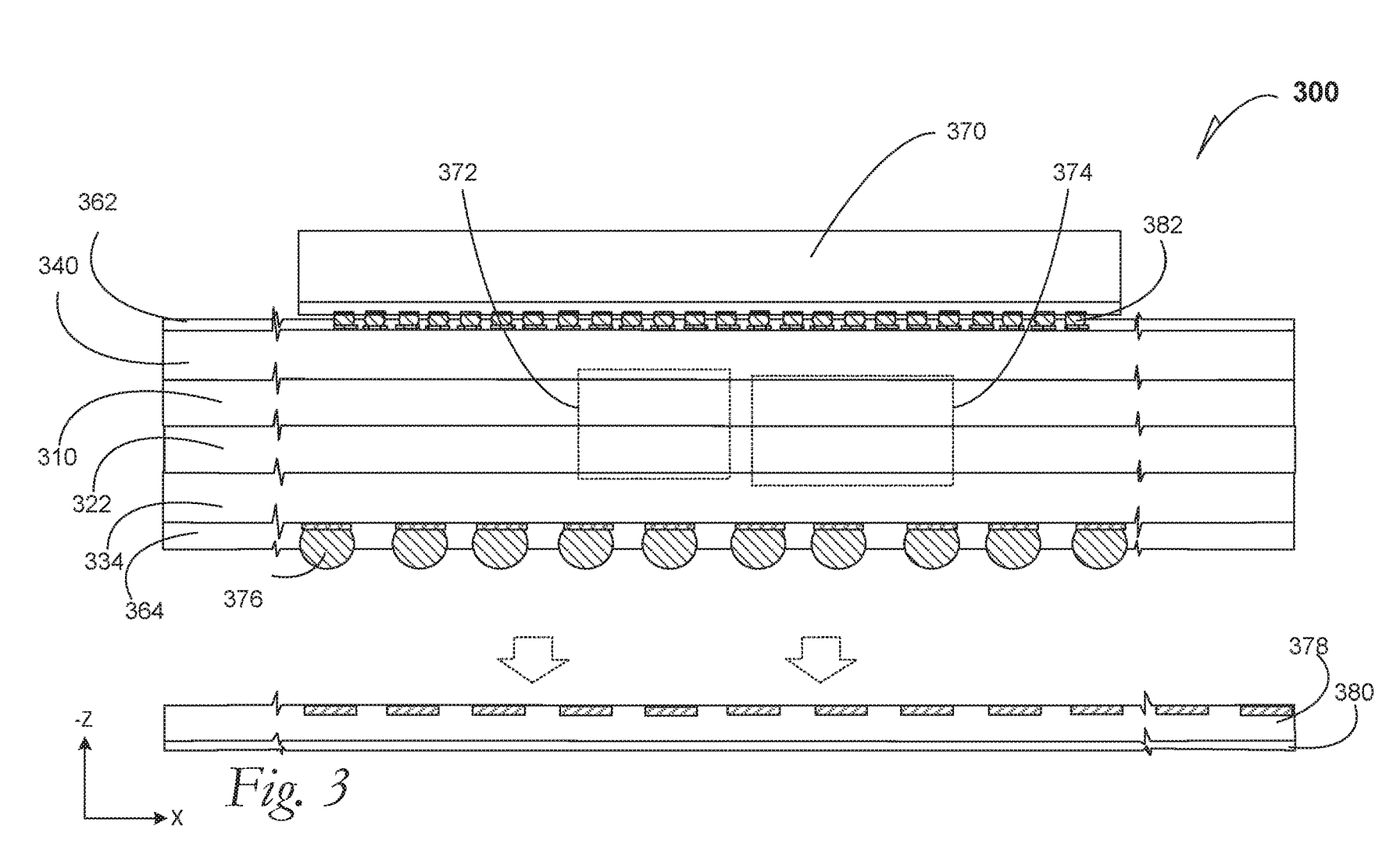
FIG. 3 is a cross-section elevation schematic of a semiconductor device package that includes several semiconductor package-embedded TFCs and package-integral magnetic-inductor embodiments.

FIG. 3 is a cross-section elevation schematic of a semiconductor device package 300 that includes several semiconductor package-embedded TFCs and package-integral magnetic-inductor embodiments. In an embodiment, a semiconductive device 370 is flip-chip mounted on a die-side solder resist layer 362, and several electrical bumps contact bond pads. The die-side solder resist layer 362 is the die side of the semiconductor package substrate.

In an embodiment, where semiconductor package substrate 107 depicted in FIG. 1G is mapped to the semiconductor device package 300, the structures of the build-up films 310 and 322 contain most of at least one eTFC and at least one iML embodiment, within a region 372. In an embodiment, where semiconductor package substrate 200 depicted in FIG. 2 is mapped to the semiconductor device package 300, the structures of the build-up films 310 and 322 contain most of at least two eTFCs and at least two iMLs, within a region 374.

In an embodiment, the semiconductive device is seated on a semiconductor package substrate a coreless substrate. In an embodiment, a coreless substrate has no convention core to resist warpage, but it relies upon inner structures such as lacquer layers stiffeners, or a motherboard for warpage resistance. In an embodiment, the semiconductive device is seated on a semiconductor package substrate that includes a core layer.

In an embodiment, at least one semiconductor package-embedded TFC and integral magnetic inductor is used in a computing system and the computing system that includes a board 378 such as a motherboard 378, that couples to the at least one semiconductor package integrated TFC and integral magnetic inductor, by an electrical connection such as an electrical bump, one occurrence of which is indicated with reference number 376. In an embodiment, the board 378 includes a shell 380 that provides both physical and dielectric protection to the semiconductive device 370, which is coupled to at least one semiconductor package integrated TFC and integral magnetic inductor embodiment.

In an embodiment, a die shadow covers approximately and area of a die flip-chip ball grid array, one electrical bump of which is indicated with reference number 382.

In an embodiment, between two and about 1,000 TFCs are located within the semiconductor package substrate under a die shadow that is formed by the semiconductive device 370. In an embodiment where the semiconductive device 370 is part of a data server, up to about 1,000 TFCs are located under the die shadow. In an embodiment in addition to the several eTFCs, a corresponding complement of iMLs are also located under the die shadow. In an embodiment, where the semiconductive device 370 is in a desktop computing system, up to 480 eTFCs and a compliment of iMLs are under the die shadow, such as the region 372 or such as the region 374, where a given region, or a combination thereof, extend up to the entire X-Y footprint of the die shadow. In an embodiment, where the semiconductive device 370 is in a desktop hand-held or mobile device such as a telephone or tablet computing system, up to 240 eTFCs and a compliment of iMLs are under the die shadow, such as the region 372 or such as the region 374, where a given region, or a combination thereof, extend up to the entire X-Y footprint of the die shadow. In an embodiment, the die shadow is represented as the approximate X-Y footprint that the several bond pads that are exposed through the die-side solder resist layer 362, that are configured for contacting the ball-grid array 382.

Figure 4:
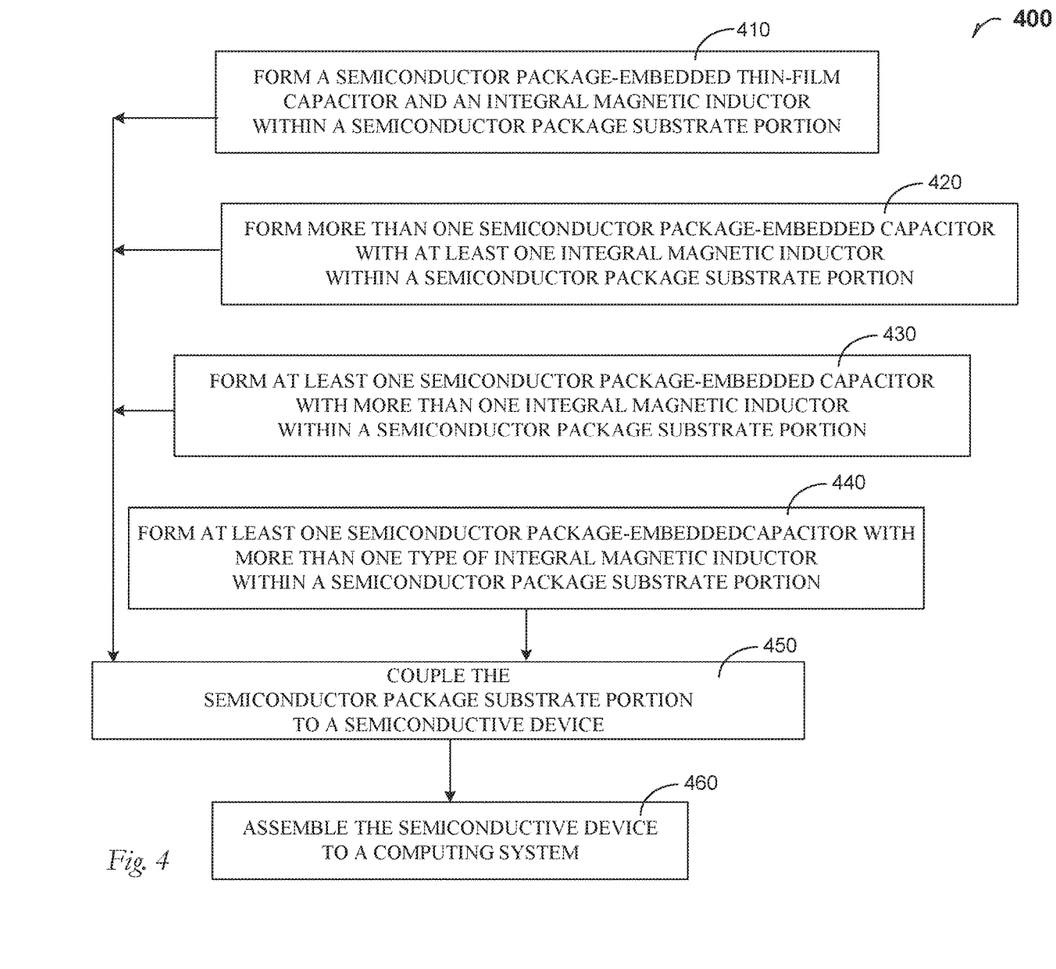
FIG. 4 is a process flow diagram according to several embodiments.

FIG. 4 is a process flow diagram according to several embodiments.

At 410, the process includes forming a semiconductor package-embedded thin-film capacitor and an integral magnetic inductor within a semiconductor package substrate portion. In a non-limiting example embodiment, the eTFC 118 and the iML 138 are formed within a semiconductor package substrate portion 110 and 122 of a semiconductor package substrate 107.

At 420, the process includes forming more than one semiconductor package-embedded thin-film capacitor and at least one integral magnetic inductor within a semiconductor package substrate portion. In a non-limiting example embodiment, the eTFCs 218 and 219 and the iML 238 are formed within a semiconductor package substrate portion 210 and 222 of a semiconductor package substrate 200.

At 430, the process includes forming at least one semiconductor package-embedded thin-film capacitor and more than one integral magnetic inductor within a semiconductor package substrate portion. In a non-limiting example embodiment, the eTFC 218 and the iMLs 239 are formed by virtue of two inductor traces 217 and 217' within a semiconductor package substrate portion 210 and 222 of a semiconductor package substrate 200.

At 440, the process includes forming at least one semiconductor package-embedded thin-film capacitor and more than one type of integral magnetic inductor within a semiconductor package substrate portion. In a non-limiting example embodiment, the eTFC 218 and the iMLs 238 and 239 are formed within a semiconductor package substrate portion 210 and 222 of a semiconductor package substrate 200.

At 450, the process includes coupling the semiconductor package substrate portion to a semiconductive device. In a non-limiting example embodiment, a completed semiconductor package substrate is coupled to a semiconductive device 370.

At 460, the process includes assembling the semiconductive device to a computing system.

Figure 5:
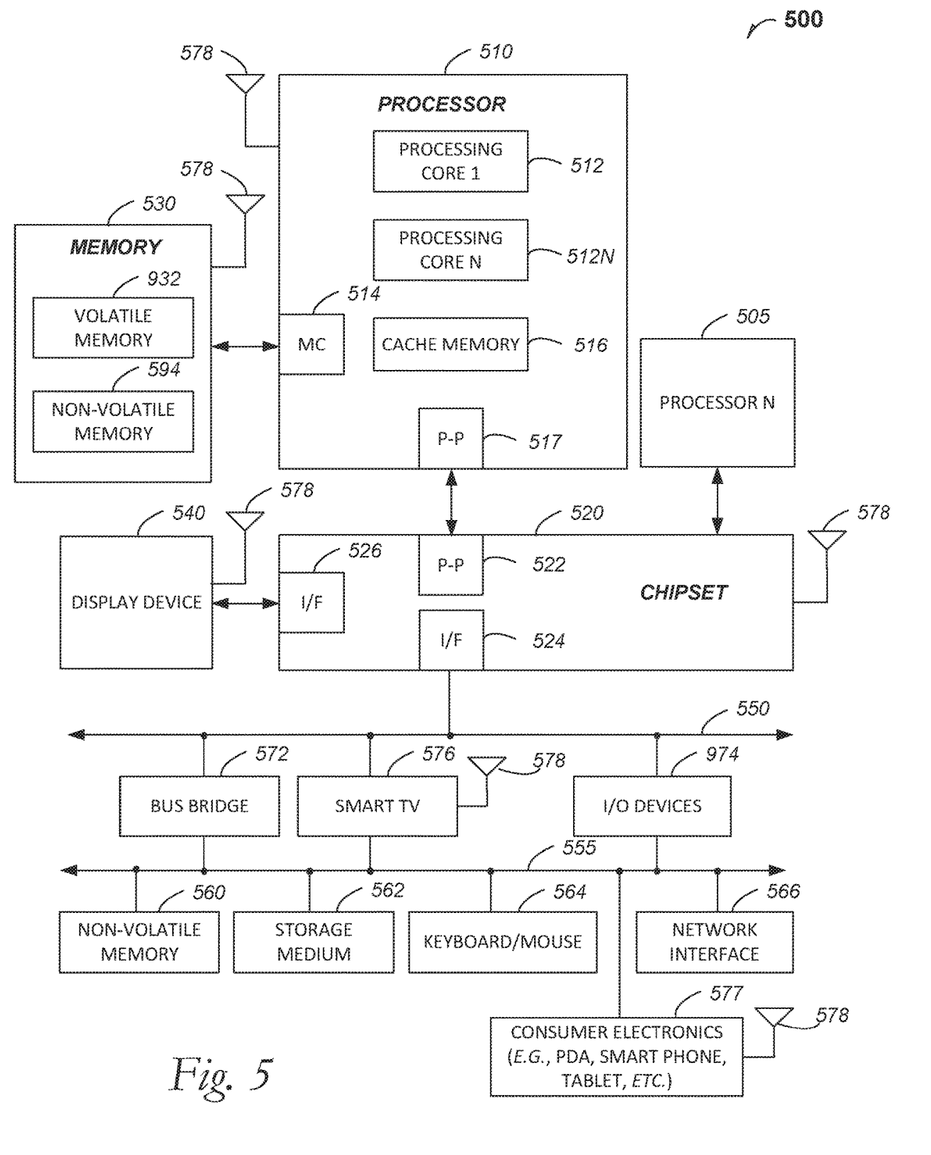
FIG. 5 is included to show an example of a higher-level device application for the disclosed embodiments.

FIG. 5 is included to show an example of a higher-level device application for the disclosed embodiments. The semiconductor package-embedded thin-film capacitor and package-integral magnetic inductor embodiments may be found in several parts of a computing system. In an embodiment, the semiconductor package-embedded thin-film capacitor and package-integral magnetic inductor embodiments can be part of a communications apparatus such as is affixed to a cellular communications tower. In an embodiment, a computing system 500 includes, but is not limited to, a desktop computer. In an embodiment, a computing system 500 includes, but is not limited to a laptop computer. In an embodiment, a computing system 500 includes, but is not limited to a tablet. In an embodiment, a computing system 500 includes, but is not limited to a notebook computer. In an embodiment, a computing system 500 includes, but is not limited to a personal digital assistant (PDA). In an embodiment, a computing system 500 includes, but is not limited to a server. In an embodiment, a computing system 500 includes, but is not limited to a workstation. In an embodiment, a computing system 500 includes, but is not limited to a cellular telephone. In an embodiment, a computing system 500 includes, but is not limited to a mobile computing device. In an embodiment, a computing system 500 includes, but is not limited to a smart phone. In an embodiment, a system 500 includes, but is not limited to an internet appliance. Other types of computing devices may be configured with the microelectronic device that includes semiconductor package-embedded thin-film capacitor and package-integral magnetic inductor embodiments.

In an embodiment, the processor 510 has one or more processing cores 512 and 512N, where 512N represents the Nth processor core inside processor 510 where N is a positive integer. In an embodiment, the electronic device system 500 using a semiconductor package-embedded thin-film capacitor and package-integral magnetic inductor embodiment that includes multiple processors including 510 and 505, where the processor 505 has logic similar or identical to the logic of the processor 510. In an embodiment, the processing core 512 includes, but is not limited to, pre-fetch logic to fetch instructions, decode logic to decode the instructions, execution logic to execute instructions and the like. In an embodiment, the processor 510 has a cache memory 516 to cache at least one of instructions and data for the semiconductor package-embedded thin-film capacitor and package-integral magnetic inductor in the system 500. The cache memory 516 may be organized into a hierarchal structure including one or more levels of cache memory.

In an embodiment, the processor 510 includes a memory controller 514, which is operable to perform functions that enable the processor 510 to access and communicate with memory 530 that includes at least one of a volatile memory 532 and a non-volatile memory 534. In an embodiment, the processor 510 is coupled with memory 530 and chipset 520. In an embodiment, the chipset 520 is part of a semiconductor package-embedded thin-film capacitor and package-integral magnetic inductor embodiment depicted in FIG. 2. The processor 510 may also be coupled to a wireless antenna 578 to communicate with any device configured to at least one of transmit and receive wireless signals. In an embodiment, the wireless antenna interface 578 operates in accordance with, but is not limited to, the IEEE 802.11 standard and its related family, Home Plug AV (HPAV), Ultra Wide Band (UWB). Bluetooth, WiMax. or any form of wireless communication protocol.

In an embodiment, the volatile memory 532 includes, but is not limited to, Synchronous Dynamic Random Access Memory (SDRAM), Dynamic Random Access Memory (DRAM). RAMBUS Dynamic Random Access Memory (RDRAM), and/or any other type of random access memory device. The non-volatile memory 534 includes, but is not limited to, flash memory, phase change memory (PCM), read-only memory (ROM), electrically erasable programmable read-only memory (EEPROM), or any other type of non-volatile memory device.

The memory 530 stores information and instructions to be executed by the processor 510. In an embodiment, the memory 530 may also store temporary variables or other intermediate information while the processor 510 is executing instructions. In the illustrated embodiment, the chipset 520 connects with processor 510 via Point-to-Point (PtP or P-P) interfaces 517 and 522. Either of these PtP embodiments may be achieved using a semiconductor package-embedded thin-film capacitor and package-integral magnetic inductor embodiment as set forth in this disclosure. The chipset 520 enables the processor 510 to connect to other elements in a semiconductor package-embedded thin-film capacitor and package-integral magnetic inductor embodiment in a system 500. In an embodiment, interfaces 517 and 522 operate in accordance with a PtP communication protocol such as the Intel® QuickPath Interconnect (QPI) or the like. In other embodiments, a different interconnect may be used.

In an embodiment, the chipset 520 is operable to communicate with the processor 510, 505N, the display device 540, and other devices 572, 576, 574, 560, 562, 564, 566, 577, etc. The chipset 520 may also be coupled to a wireless antenna 578 to communicate with any device configured to at least do one of transmit and receive wireless signals.

The chipset 520 connects to the display device 540 via the interface 526. The display 540 may be, for example, a liquid crystal display (LCD), a plasma display, cathode ray tube (CRT) display, or any other form of visual display device. In an embodiment, the processor 510 and the chipset 520 are merged into a semiconductor package-embedded thin-film capacitor and package-integral magnetic inductor embodiment in a system. Additionally, the chipset 520 connects to one or more buses 550 and 555 that interconnect various elements 574, 560, 562, 564, and 566. Buses 550 and 555 may be interconnected together via a bus bridge 572 such as at least one semiconductor package-embedded thin-film capacitor and package-integral magnetic inductor embodiment. In an embodiment, the chipset 520, via interface 524, couples with a non-volatile memory 560, a mass storage device(s) 562, a keyboard/mouse 564, a network interface 566, smart TV 576, and the consumer electronics 577, etc.

In an embodiment, the mass storage device 562 includes, but is not limited to, a solid-state drive, a hard disk drive, a universal serial bus flash memory drive, or any other form of computer data storage medium. In one embodiment, the network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB). Bluetooth, WiMax, or any form of wireless communication protocol.

While the modules shown in FIG. 5 are depicted as separate blocks within the semiconductor package-embedded thin-film capacitor and package-integral magnetic inductor embodiments in a computing system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into the processor core 512.

To illustrate the semiconductor package-embedded thin-film capacitor and package-integral magnetic inductor embodiments and methods disclosed herein, a non-limiting list of examples is provided herein:

Example 1 is a semiconductor package substrate, comprising: a first build-up film including a first lithograph surface; a second and adjacent build-up film including a recess that abuts the first lithographic surface; a thin-film capacitor, wherein the thin-film capacitor is seated on the first lithographic surface, and at least partially embedded in the second and adjacent build-up film; and a magnetic inductor, wherein the magnetic inductor includes an inductor trace and a first magnetic-particle body within the recess, and a complementary magnetic-particle body that contacts the inductor trace, the first magnetic-particle body and the first build-up film.

In Example 2, the subject matter of Example 1 optionally includes wherein the first build-up film and the second and adjacent build-up film are part of a semiconductor package substrate portion that includes a die side and a land side further including: a semiconductive device contacting the die side, wherein the semiconductive device is coupled to the embedded thin-film capacitor and to the integral magnetic inductor, wherein the semiconductive device forms a die shadow on the die side, and wherein the die shadow overlaps the embedded thin-film capacitor and the integral magnetic inductor.

In Example 3, the subject matter of any one or more of Examples 1-2 optionally include wherein the first build-up film and the second and adjacent build-up film are part of a semiconductor package substrate portion that includes a die side and a land side further including: a ball-pad array on the die side, where ball-pad pad array is exposed through a die-side solder resist semiconductive device contacting the die side, wherein the ball-pad array is coupled to the embedded thin-film capacitor and to the integral magnetic inductor, wherein the ball-pad array forms a die shadow on the die side, and wherein the die shadow overlaps the embedded thin-film capacitor and the integral magnetic inductor.

In Example 4, the subject matter of any one or more of Examples 1-3 optionally include wherein the first build-up film and the second and adjacent build-up film are part of a semiconductor package substrate portion that includes a die side and a land side, further including: a capacitor via that communicates to the die side and that contacts the thin-film capacitor.

In Example 5, the subject matter of any one or more of Examples 1-4 optionally include wherein the first build-up film and the second and adjacent build-up film are part of a semiconductor package substrate portion that includes a die side and a land side, and wherein the thin-film capacitor is a first thin-film capacitor, further including: a first capacitor via that communicates to the die side and the contacts the first thin-film capacitor; and a subsequent thin-film capacitor, wherein the subsequent thin-film capacitor is seated on the first lithographic surface, and partially embedded in the second and adjacent build-up film.

In Example 6, the subject matter of any one or more of Examples 1-5 optionally include wherein the first build-up film and the second and adjacent build-up film are part of a semiconductor package substrate portion that includes a die side and a land side, and wherein the thin-film capacitor is a first thin-film capacitor, further including: a first capacitor via that communicates to the die side and that contacts the first thin-film capacitor; a subsequent thin-film capacitor, wherein the subsequent thin-film capacitor is seated on the first lithographic surface, and partially embedded in the second and adjacent build-up film; and wherein one of the first and subsequent thin-film capacitors is adjacent the magnetic inductor.

In Example 7, the subject matter of any one or more of Examples 1-6 optionally include wherein the first build-up film and the second and adjacent build-up film are part of a semiconductor package substrate portion that includes a die side and a land side, and the magnetic inductor is a first magnetic inductor, further including: a capacitor via that communicates to the die side and that contacts the thin-film capacitor; a subsequent magnetic inductor, wherein the subsequent magnetic inductor is adjacent one of the thin-film capacitor and the first magnetic inductor, wherein the subsequent magnetic inductor includes a subsequent inductor trace and a subsequent first magnetic-particle body within the recess, and a subsequent complementary magnetic-particle body that contacts the subsequent inductor trace, the subsequent first magnetic-particle body and the first build-up film.

In Example 8, the subject matter of any one or more of Examples 1-7 optionally include wherein the first build-up film and the second and adjacent build-up film are part of a semiconductor package substrate portion that includes a die side and a land side, wherein the recess is a first recess, and wherein the magnetic inductor is a first magnetic inductor, further including: a capacitor via that communicates to the die side and that contacts the thin-film capacitor; a subsequent magnetic inductor, wherein the subsequent magnetic inductor is adjacent one of the thin-film capacitor and the first magnetic inductor, wherein the subsequent magnetic inductor includes two subsequent inductor traces and a subsequent first magnetic-particle body within a subsequent recess with the second and adjacent build-up film, and a subsequent complementary magnetic-particle body that contacts the two subsequent inductor traces, the subsequent first magnetic-particle body and the first build-up film.

In Example 9, the subject matter of any one or more of Examples 1-8 optionally include wherein the first build-up film and the second and adjacent build-up film are part of a semiconductor package substrate portion that includes a die side and a land side, wherein the inductor trace is a first inductor trace, further including: a capacitor via that communicates to the die side and that contacts the thin-film capacitor; wherein the first inductor trace is one of two inductor traces that are contacted by the first magnetic-particle body within the recess, and the subsequent complementary magnetic-particle body.

In Example 10, the subject matter of any one or more of Examples 1-9 optionally include wherein the first build-up film and the second and adjacent build-up film are part of a semiconductor package substrate portion that includes a die side and a land side, wherein the recess is a first recess, and wherein the magnetic inductor is a first magnetic inductor, further including: a capacitor via that communicates to the die side and that contacts the thin-film capacitor; a subsequent magnetic inductor, wherein the subsequent magnetic inductor is adjacent one of the thin-film capacitor and the first magnetic inductor, wherein the subsequent magnetic inductor includes a subsequent inductor trace and a subsequent first magnetic-particle body within a subsequent recess within the second and adjacent build-up film, and a subsequent complementary magnetic-particle body that contacts the subsequent inductor trace, the subsequent magnetic-particle body and the first build-up film.

In Example 11, the subject matter of any one or more of Examples 1-10 optionally include wherein the first build-up film and the second and adjacent build-up film are part of a semiconductor package substrate portion that includes a die side and a land side, further including: a semiconductive device contacting the die side, wherein the semiconductive device is coupled to the embedded thin-film capacitor and to the integral magnetic inductor; an electrical bump on the land side; and a board contacting the electrical bump.

In Example 12, the subject matter of any one or more of Examples 1-11 optionally include wherein the first build-up film and the second and adjacent build-up film are part of a semiconductor package substrate portion that includes a die side and a land side, further including: a package via that communicates from the die side, through the first build-up film, the second and adjacent build-up film, and the further communicates to the land side.

In Example 13, the subject matter of any one or more of Examples 1-12 optionally include wherein the thin-film capacitor includes, beginning at first lithographic surface, a copper-containing layer, a nickel-containing layer, a barium titanate (BTO) containing layer and a copper-containing layer.

In Example 14, the subject matter of any one or more of Examples 1-13 optionally include wherein the thin-film capacitor includes, beginning at first lithographic surface, a first metal-containing layer, a subsequent metal-containing layer different from the first metal-containing layer, a dielectric layer and a third metal-containing layer.

Example 15 is a process of forming a semiconductor package substrate, comprising: seating a thin-film capacitor on a first build-up film; locating an inductor trace and a first magnetic-particle paste in a recess in an adjacent build up film; locating a subsequent complementary magnetic-particle paste adjacent the first magnetic particle paste, wherein the subsequent complementary magnetic-particle paste contacts the inductor trace; forming a land side and a die side that are coupled to the first and second and adjacent build-up films; and wherein the die side includes a die footprint that overlaps the thin-film capacitor and the magnetic inductor.

In Example 16, the subject matter of Example 15 optionally includes wherein the thin-film capacitor is a first thin-film capacitor, further including seating a subsequent thin-film capacitor on the first build-up film.

In Example 17, the subject matter of any one or more of Examples 15-16 optionally include wherein the inductor trace is a first inductor trace, further including locating a subsequent inductor trace with the first magnetic-particle paste in the recess in the adjacent build up film; locating the subsequent complementary magnetic-particle paste adjacent the first magnetic particle paste, wherein the subsequent complementary magnetic-particle paste contacts the first inductor trace and the subsequent inductor trace.

Example 18 is a computing system, comprising: a first build-up film of a semiconductor package substrate, wherein the first build-up film includes a first lithograph surface, and wherein the semiconductor package substrate includes a die side and a land side; a second and adjacent build-up film including a recess that abuts the first lithographic surface; a thin-film capacitor, wherein the thin-film capacitor is seated on the first lithographic surface, and partially embedded in the second and adjacent build-up film; a magnetic inductor, wherein the magnetic inductor includes an inductor trace and a first magnetic-particle body within the recess, and a complementary magnetic-particle body that contacts the inductor trace, the first magnetic-particle body and the first build-up film; a semiconductive device contacting the die side, wherein the semiconductive device is coupled to the embedded thin-film capacitor and to the integral magnetic inductor, wherein the semiconductive device forms a die shadow on the die side, and wherein the die shadow overlaps the embedded thin-film capacitor and the integral magnetic inductor; and a board contacting the semiconductor package substrate at the land side.

In Example 19, the subject matter of Example 18 optionally includes wherein the board is part of a data server.

In Example 20, the subject matter of any one or more of Examples 18-19 optionally include wherein the board includes an external shell.

In Example 21, the subject matter of any one or more of Examples 18-20 optionally include wherein the semiconductive device is part of a chipset.

In Example 22, the subject matter of any one or more of Examples 16-21 optionally include wherein the semiconductive device is part of a chipset, wherein the board includes an external shell, and wherein the embedded thin-film capacitor is one of more than three embedded thin-film capacitors.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package substrate, comprising:
   a first build-up film including a first lithograph surface;
   a second and adjacent build-up film including a recess that abuts the first lithographic surface;
   a thin-film capacitor, wherein the thin-film capacitor is seated on the first lithographic surface, and at least partially embedded in the second and adjacent build-up film; and
   a magnetic inductor, wherein the magnetic inductor includes an inductor trace and a first magnetic-particle body within the recess, and a complementary magnetic-particle body that contacts the inductor trace, the first magnetic-particle body and the first build-up film.

2. The semiconductor package substrate of claim 1, wherein the first build-up film and the second and adjacent build-up film are part of a semiconductor package substrate portion that includes a die side and a land side further including:
   a semiconductive device contacting the die side, wherein the semiconductive device is coupled to the embedded thin-film capacitor and to the integral magnetic inductor, wherein the semiconductive device forms a die shadow on the die side, and wherein the die shadow overlaps the embedded thin-film capacitor and the integral magnetic inductor.

3. The semiconductor package substrate of claim 1, wherein the first build-up film and the second and adjacent build-up film are part of a semiconductor package substrate portion that includes a die side and a land side further including:
   a ball-pad array on the die side, where ball-pad pad array is exposed through a die-side solder resist semiconductive device contacting the die side, wherein the ball-pad array is coupled to the embedded thin-film capacitor and to the integral magnetic inductor, wherein the ball-pad array forms a die shadow on the die side, and wherein the die shadow overlaps the embedded thin-film capacitor and the integral magnetic inductor.

4. The semiconductor package substrate of claim 1, wherein the first build-up film and the second and adjacent build-up film are part of a semiconductor package substrate portion that includes a die side and a land side, further including:
   a capacitor via that communicates to the die side and that contacts the thin-film capacitor.

5. The semiconductor package substrate of claim 1, wherein the first build-up film and the second and adjacent build-up film are part of a semiconductor package substrate portion that includes a die side and a land side, further including:
   a first capacitor via that communicates to the die side and that contacts the thin-film capacitor; and
   a subsequent capacitor via that communicates to the die side and that contacts the thin-film capacitor.

6. The semiconductor package substrate of claim 1, wherein the first build-up film and the second and adjacent build-up film are part of a semiconductor package substrate portion that includes a die side and a land side, and wherein the thin-film capacitor is a first thin-film capacitor, further including:
   a first capacitor via that communicates to the die side and the contacts the first thin-film capacitor; and
   a subsequent thin-film capacitor, wherein the subsequent thin-film capacitor is seated on the first lithographic surface, and partially embedded in the second and adjacent build-up film.

7. The semiconductor package substrate of claim 1, wherein the first build-up film and the second and adjacent build-up film are part of a semiconductor package substrate portion that includes a die side and a land side, and wherein the thin-film capacitor is a first thin-film capacitor, further including:
   a first capacitor via that communicates to the die side and that contacts the first thin-film capacitor;
   a subsequent thin-film capacitor, wherein the subsequent thin-film capacitor is seated on the first lithographic surface, and partially embedded in the second and adjacent build-up film; and
   wherein one of the first and subsequent thin-film capacitors is adjacent the magnetic inductor.

8. The semiconductor package substrate of claim 1, wherein the first build-up film and the second and adjacent build-up film are part of a semiconductor package substrate portion that includes a die side and a land side, and the magnetic inductor is a first magnetic inductor, further including:
   a capacitor via that communicates to the die side and that contacts the thin-film capacitor;
   a subsequent magnetic inductor, wherein the subsequent magnetic inductor is adjacent one of the thin-film capacitor and the first magnetic inductor, wherein the subsequent magnetic inductor includes a subsequent inductor trace and a subsequent first magnetic-particle body within the recess, and a subsequent complementary magnetic-particle body that contacts the subsequent inductor trace, the subsequent first magnetic-particle body and the first build-up film.

9. The semiconductor package substrate of claim 1, wherein the first build-up film and the second and adjacent build-up film are part of a semiconductor package substrate portion that includes a die side and a land side, wherein the recess is a first recess, and wherein the magnetic inductor is a first magnetic inductor, further including:
   a capacitor via that communicates to the die side and that contacts the thin-film capacitor;
   a subsequent magnetic inductor, wherein the subsequent magnetic inductor is adjacent one of the thin-film capacitor and the first magnetic inductor, wherein the subsequent magnetic inductor includes two subsequent inductor traces and a subsequent first magnetic-particle body within a subsequent recess with the second and adjacent build-up film, and a subsequent complementary magnetic-particle body that contacts the two subsequent inductor traces, the subsequent first magnetic-particle body and the first build-up film.

10. The semiconductor package substrate of claim 1, wherein the first build-up film and the second and adjacent build-up film are part of a semiconductor package substrate portion that includes a die side and a land side, wherein the inductor trace is a first inductor trace, further including:
- a capacitor via that communicates to the die side and that contacts the thin-film capacitor;
- wherein the first inductor trace is one of two inductor traces that are contacted by the first magnetic-particle body within the recess, and the subsequent complementary magnetic-particle body.

11. The semiconductor package substrate of claim 1, wherein the first build-up film and the second and adjacent build-up film are part of a semiconductor package substrate portion that includes a die side and a land side, wherein the recess is a first recess, and wherein the magnetic inductor is a first magnetic inductor, further including:
- a capacitor via that communicates to the die side and that contacts the thin-film capacitor;
- a subsequent magnetic inductor, wherein the subsequent magnetic inductor is adjacent one of the thin-film capacitor and the first magnetic inductor, wherein the subsequent magnetic inductor includes a subsequent inductor trace and a subsequent first magnetic-particle body within a subsequent recess within the second and adjacent build-up film, and a subsequent complementary magnetic-particle body that contacts the subsequent inductor trace, the subsequent magnetic-particle body and the first build-up film.

12. The semiconductor package substrate of claim 1, wherein the first build-up film and the second and adjacent build-up film are part of a semiconductor package substrate portion that includes a die side and a land side, further including:
- a semiconductive device contacting the die side, wherein the semiconductive device is coupled to the embedded thin-film capacitor and to the integral magnetic inductor;
- an electrical bump on the land side; and
- a board contacting the electrical bump.

13. The semiconductor package substrate of claim 1, wherein the first build-up film and the second and adjacent build-up film are part of a semiconductor package substrate portion that includes a die side and a land side, further including:
- a package via that communicates from the die side, through the first build-up film, the second and adjacent build-up film, and the further communicates to the land side.

14. The semiconductor package substrate of claim 1, wherein the thin-film capacitor includes, beginning at first lithographic surface, a copper-containing layer, a nickel-containing layer, a barium titanate (BTO) containing layer and a copper-containing layer.

15. The semiconductor package substrate of claim 1, wherein the thin-film capacitor includes, beginning at first lithographic surface, a first metal-containing layer, a subsequent metal-containing layer different from the first metal-containing layer, a dielectric layer and a third metal-containing layer.

16. A process of forming a semiconductor package substrate, comprising:
- seating a thin-film capacitor on a first build-up film;
- locating an inductor trace and a first magnetic-particle paste in a recess in an adjacent build up film;
- locating a subsequent complementary magnetic-particle paste adjacent the first magnetic particle paste, wherein the subsequent complementary magnetic-particle paste contacts the inductor trace;
- forming a land side and a die side that are coupled to the first and second and adjacent build-up films; and
- wherein the die side includes a die footprint that overlaps the thin-film capacitor and the magnetic inductor.

17. The process of claim 16, wherein the thin-film capacitor is a first thin-film capacitor, further including seating a subsequent thin-film capacitor on the first build-up film.

18. The process of claim 16, wherein the inductor trace is a first inductor trace, further including locating a subsequent inductor trace with the first magnetic-particle paste in the recess in the adjacent build up film;
- locating the subsequent complementary magnetic-particle paste adjacent the first magnetic particle paste, wherein the subsequent complementary magnetic-particle paste contacts the first inductor trace and the subsequent inductor trace.

19. A computing system, comprising:
- a first build-up film of a semiconductor package substrate, wherein the first build-up film includes a first lithograph surface, and wherein the semiconductor package substrate includes a die side and a land side;
- a second and adjacent build-up film including a recess that abuts the first lithographic surface;
- a thin-film capacitor, wherein the thin-film capacitor is seated on the first lithographic surface, and partially embedded in the second and adjacent build-up film;
- a first capacitor via that communicates to the die side and that contacts the thin-film capacitor;
- a subsequent capacitor via that communicates to the die side and that contacts the thin-film capacitor;
- a subsequent thin-film capacitor, wherein the subsequent thin-film capacitor is seated on the first lithographic surface, and partially embedded in the second and adjacent build-up film;
- a magnetic inductor, wherein the magnetic inductor includes an inductor trace and a first magnetic-particle body within the recess, and a complementary magnetic-particle body that contacts the inductor trace, the first magnetic-particle body and the first build-up film;
- a semiconductive device contacting the die side, wherein the semiconductive device is coupled to the embedded thin-film capacitor and to the integral magnetic inductor, wherein the semiconductive device forms a die shadow on the die side, and wherein the die shadow overlaps the embedded thin-film capacitor and the integral magnetic inductor; and
- a board contacting the semiconductor package substrate at the land side.

20. The computing system of claim 19, wherein the board is part of a data server.

21. The computing system of claim 19, wherein the board includes an external shell.

22. The computing system of claim 19, further wherein the semiconductive device is part of a chip set.

23. The computing system of claim 19 further wherein the semiconductive device is part of a chipset, wherein the board includes an external shell and wherein the embedded thin-film capacitor is one of more than three embedded thin-film capacitors.

* * * * *